United States Patent
Lairson et al.

(10) Patent No.: US 9,606,459 B2
(45) Date of Patent: Mar. 28, 2017

(54) MONOLITHIC EUV TRANSPARENT MEMBRANE AND SUPPORT MESH AND METHOD OF MANUFACTURING SAME

(71) Applicant: LUXEL CORPORATION, Friday Harbor, WA (US)

(72) Inventors: Bruce Lairson, Friday Harbor, WA (US); David Grove, Friday Harbor, WA (US); Heidi Lopez, Friday Harbor, WA (US); Travis Ayers, Friday Harbor, WA (US)

(73) Assignee: LUXEL CORPORATION, Friday Harbor, WA (US)

( * ) Notice: Subject to any disclaimer, the term of this patent is extended or adjusted under 35 U.S.C. 154(b) by 14 days.

(21) Appl. No.: 14/584,928

(22) Filed: Dec. 29, 2014

(65) Prior Publication Data

US 2015/0212434 A1 Jul. 30, 2015

Related U.S. Application Data

(60) Provisional application No. 61/932,017, filed on Jan. 27, 2014.

(51) Int. Cl.
| | |
|---|---|
| *G03B 27/52* | (2006.01) |
| *G03B 27/58* | (2006.01) |
| *G03B 27/32* | (2006.01) |
| *G03F 7/20* | (2006.01) |
| *G03F 1/62* | (2012.01) |

(52) U.S. Cl.
CPC ............ *G03F 7/70983* (2013.01); *G03F 1/62* (2013.01)

(58) Field of Classification Search
CPC ............ G03F 7/70983; G03F 7/70958; G03F 7/70866; G03F 7/70916; G03F 7/70283; G03F 7/70191; G03F 7/702; G03F 7/70216; G03F 7/70308; G03F 7/70733; G03F 1/142; G03F 7/22; G03F 7/24; G03F 7/62; G03F 7/64; G02B 5/204; G02B 5/208
USPC ............ 355/30, 52, 53, 55, 67–77; 252/588; 430/5; 359/359–361; 250/492.1, 492.2, 250/492.22, 493.1, 548
See application file for complete search history.

(56) References Cited

U.S. PATENT DOCUMENTS

| | | | |
|---|---|---|---|
| 6,507,641 B1 | 1/2003 | Kondo et al. | |
| 6,623,893 B1 * | 9/2003 | Levinson | ............... B82Y 10/00 428/14 |

(Continued)

FOREIGN PATENT DOCUMENTS

| | | |
|---|---|---|
| KR | 10-2013-0074066 A | 7/2013 |

OTHER PUBLICATIONS

International Search Authority of WIPO (US); Notification of Transmittal of Int'l Search Report & Written Opinion; dated Mar. 25, 2015; pp. 1-8.

(Continued)

*Primary Examiner* — Christina Riddle
(74) *Attorney, Agent, or Firm* — Cloutier Ortega

(57) ABSTRACT

An apparatus according to the present invention comprises a membrane layer and a supporting supportive mesh, wherein the membrane layer and the supportive mesh form a monolithic structure that absorbs less than ten percent of EUV (Extreme Ultraviolet) light passing through it in which the membrane layer is composed of a metal-ceramic composite.

15 Claims, 4 Drawing Sheets

(56) References Cited

U.S. PATENT DOCUMENTS

| | | | | |
|---|---|---|---|---|
| 2008/0113491 | A1* | 5/2008 | Wood | B82Y 10/00 438/460 |
| 2008/0259291 | A1* | 10/2008 | Banine | G03F 1/84 355/30 |
| 2009/0104544 | A1* | 4/2009 | Kubota | B82Y 10/00 430/5 |
| 2009/0291372 | A1 | 11/2009 | Kubota et al. | |
| 2012/0045714 | A1 | 2/2012 | Akiyama et al. | |
| 2014/0065525 | A1* | 3/2014 | Yamada | G03F 1/142 430/5 |
| 2014/0370423 | A1* | 12/2014 | Goldfarb | G03F 1/22 430/5 |

OTHER PUBLICATIONS

Lairson, Bruce et al.; Luxeel Corporation; "Adhesive-free Zirconium Mesh and ZrB2/ Zr Ultrathin Membranes"; www.cvent.com/: "2013 International Symposium . . . " pp. 1-2, Oct. 2013.

Lawrence Livermore National Lab.; Bajt et al.; "Oxidation resistance and microstructure . . . " UCRL-JRNL-213175; Jun. 23, 2005; pp. 1-35.

* cited by examiner

MONOLITHIC EUV TRANSPARENT MEMBRANE AND SUPPORT MESH AND METHOD OF MANUFACTURING SAME

This application claims the benefit of U.S. Provisional Application No. 61/932,017, entitled "A Monolithic EUV transparent membrane and support mesh and method of manufacturing same," filed Jan. 27, 2014, which is incorporated by reference in its entirety herein for all purposes.

BACKGROUND

Nearly all of today's electronic devices rely on semiconductor components known as integrated circuits (ICs), which are most commonly manufactured through a process known as optical lithography. Lithography is a patterning method that uses light to transfer a geometric pattern from a photomask to a light-sensitive chemical "photoresist", or simply "resist," on to a substrate, such as a wafer of semiconductive material. A series of chemical treatments are used to either engrave the exposure pattern into the substrate, or enable new material to be deposited in the desired pattern to be deposited onto the substrate. By repeating this process using different photomasks, layers of an integrated circuit are gradually formed on the substrate. In complex integrated circuits, a modern CMOS wafer may go through the photolithographic cycle up to 50 times. The state of the art in optical lithography, particularly the wavelength of the light being used, is a gating factor in the ability to make increasingly smaller features on ICs.

Generally speaking, optical lithography begins with cleaning step, where a wet chemical treatment is used to remove any contaminants from its surface. The wafer may then be dried by heating it to a temperature sufficient to drive off any moisture present on the wafer surface. A liquid or gaseous "adhesion promoter", such as Bis(trimethylsilyl) amine ("hexamethyldisilazane", HMDS), may then be applied to the wafer surface in order to promote adhesion of the photoresist.

Next, the wafer is coated with a layer of photoresist by spin coating. Photoresist describes a category of light-sensitive materials. In the case of a so-called "positive photoresist," the exposure to light causes a chemical reaction in the photoresist, which makes the exposed photoresist soluble in a "developer" solution. (With a "negative photoresist," unexposed regions are soluble in the developer.) Typically, a liquid solution of photoresist is dispensed onto the wafer, and the wafer is spun rapidly to produce a uniformly thick layer. The wafer is then exposed to a pattern of intense light via a photomask, causing the exposed photoresist to become soluble. The exposed photoresist is then removed, exposing regions of the substrate corresponding to the pattern created by the photomask.

Photomasks may be protected from particle contamination, a significant problem in semiconductor manufacturing, by a thin transparent film called a pellicle, mounted to one side of the photomask. The pellicle is placed far enough away from the mask so that particles that land on the pellicle will be out of focus and therefore not transferred to the wafer. Consequently, the optical properties of the pellicle must be taken into account.

After the soluble photoresist is removed, a chemical etching agent may applied to remove the uppermost layer of the substrate in any areas that are not protected by photoresist. Alternatively or additionally, material may be deposited into areas not protected by the substrate. The remaining photoresist is removed and the substrate now with a pattern corresponding to the photomask on its surface. This process may then be repeated using a different photomask for each layer of the desired integrated circuit.

With the progress of technology and the reduction of the feature size, the wavelength of the exposure light had to be reduced several times. Currently, the 193 nm lithography combined with immersion and double patterning technology is the state of the art.

Shorter wavelength lithography, known as next generation lithography (NGL), has been studied in order to produce IC with even smaller features. NGL uses shorter ultraviolet light (157 nm), extreme ultraviolet (EUV) light (e.g. 13.5 nm), X-ray (0.4 nm), and the even shorter wavelengths of electron and ion beams. Due to its optical characteristics, EUV lithography is generally accepted as the natural extension of optical lithography and is currently the most promising NGL technology. However, to this day, research and development of EUV technology has cost several billion US dollars worldwide. A single EUV exposure tool costs about US$70 million.

While most other NGLs require one-fold image reduction membrane masks, EUVL uses masks with four-fold image reduction, which makes mask fabrication feasible with current technology. However, in abandoning 157 nm lithography, the industry has created a technological jump from 193 nm to 13.5 nm wavelength, creating complex challenges across the board. Therefore, EUVL technology includes EUV resist technology, EUV aligners or printers, and EUV masks, as well as metrology, inspection, and defectivity controls.

One important aspect to bear in mind is the fact that all available materials are strong absorbers of EUV light and no material is transparent enough to make use of refractive optics (e.g. lenses). Therefore, it is necessary to make use of reflective optics only (e.g. mirrors) in EUVL optical systems.

However, challenges are present in almost every aspect of EUVL technology. Some challenges are common to all NGL technologies, e.g. resist resolution and line-edge roughness (LER). Other challenges are unique to EUVL, e.g. resist outgassing owing to the EUVL high-vacuum environment. In the past 20 years the main topics of research in EUVL have been: source, optics, mask, multilayer coating, resist, metrology, reticle handling, defects, and contamination control. It is, for example, a critical task to create a defect-free EUVL mask. EUVL mask technology includes mask blank preparation and pattern fabrication. Additionally, because of the harsh environment necessary for EUV lithography, it has previously been difficult or impossible to produce suitable protective pellicles, strong enough to shield the photomask from debris while still being suitably transparent to EUV light. Thus, what is needed is an EUV transparent membrane that is resilient enough to withstand the harsh vacuum environment necessary for EUV lithography.

BRIEF DESCRIPTION OF THE DRAWINGS

Various embodiments in accordance with the present disclosure will be described with reference to the drawings, in which.

DETAILED DESCRIPTION

Pursuant to the patent laws of the United States, this detailed description, discusses various illustrative embodiments of an EUV transparent support mesh ("the present support mesh") and methods of manufacturing the same, with reference to the accompanying drawings. These illustrative embodiments are provided, as required by law, in order to give persons having ordinary skill in the relevant art a full, clear, and concise description of the invention defined by the claims, and to enable such a person to appreciate and understand how to make and use, not only the described illustrative embodiments of the present support mesh and associated methods of manufacturing, but various other embodiments that fall within the conceptual scope of present support mesh and associated methods of manufacturing, despite those various other embodiments not being explicitly described herein.

Neither this detailed description, nor the accompanying drawings, act to define or otherwise limit the inventive subject matter to which the inventors and/or the inventors' assignee(s) claim exclusive rights; that is the exclusive role of the claims which follow. Accordingly, this description should not be read to limit the scope of the claimed subject matter, nor imply any preference of the described embodiments over any other embodiment, unless such a limitation or preference is explicitly identified herein. For example, although the illustrative embodiments focus on a EUV transparent support mesh for use with a pellicle in EUV lithography, the inventive support mesh defined by the claims are intentionally not so limited.

Figure 1A:
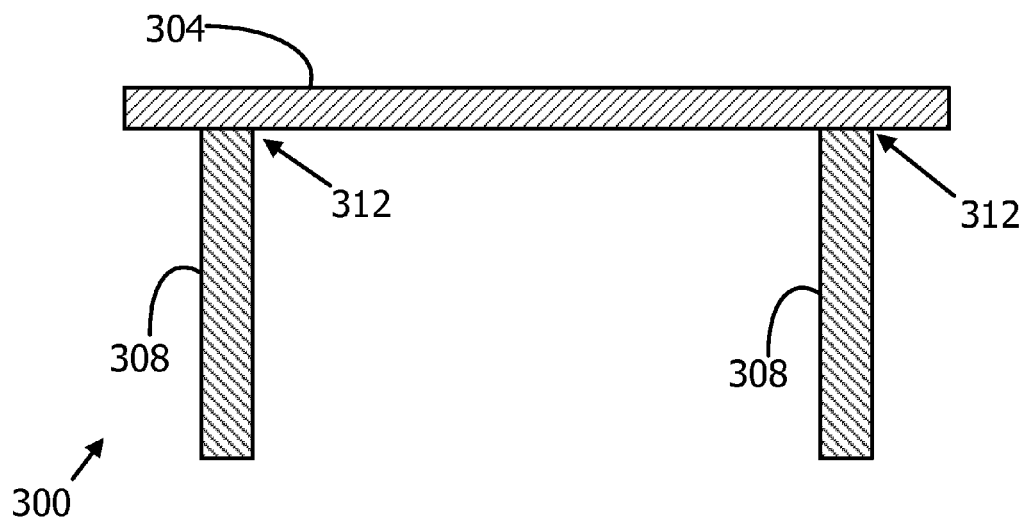
FIG. 1A is a partial cross-sectional view of a EUV transparent membrane and supporting mesh in accordance with various aspects of the present monolithic EUV transparent membrane and supporting mesh.

FIG. 1A illustrates a cross-section of a pellicle 300 suitable for use in EUV lithography and incorporating an ultrathin membrane 304 and aspects of the present supportive mesh 308. Advantageously, a pellicle 300 manufactured in accordance with aspects of the methods described below will be a monolithic structure, with no adhesive necessary at the junction 312 between membrane 304 and supportive mesh 308. The membrane 304 advantageously has a thickness of less than or equal to twenty five nanometers (25 nm) and composed of materials that absorb low levels of EUV radiation. For example, a composite membrane composed of $ZrB_2$ and Zr is suitable.

The supportive mesh 308 is advantageously made of a relatively strong material and low levels of EUV absorption. For example, a zirconium or boron mesh is suitable. Preferably, the pellicle 300 will have a composite EUV transmission rate of at least ninety percent (90%).

In a preferred embodiment of the present pellicle 300, the thickness $t_M$ of the Zr/$ZrB_2$ composite membrane is preferably twenty nanometers (20 nm). The bars of the supportive mesh 308 preferably have a width $W_B$ between one half (½) and two (2) microns, a thickness is of fifty (50) to two hundred (200) nanometers, and a pitch of twenty five (100) to three hundred (300) micrometers. A boron mesh manufactured in accordance with the present methods and having such preferred dimensions has been found to have an average EUV transparency of ninety six percent (96%) to ninety nine point seven percent (99.7%).

Figure 1B:
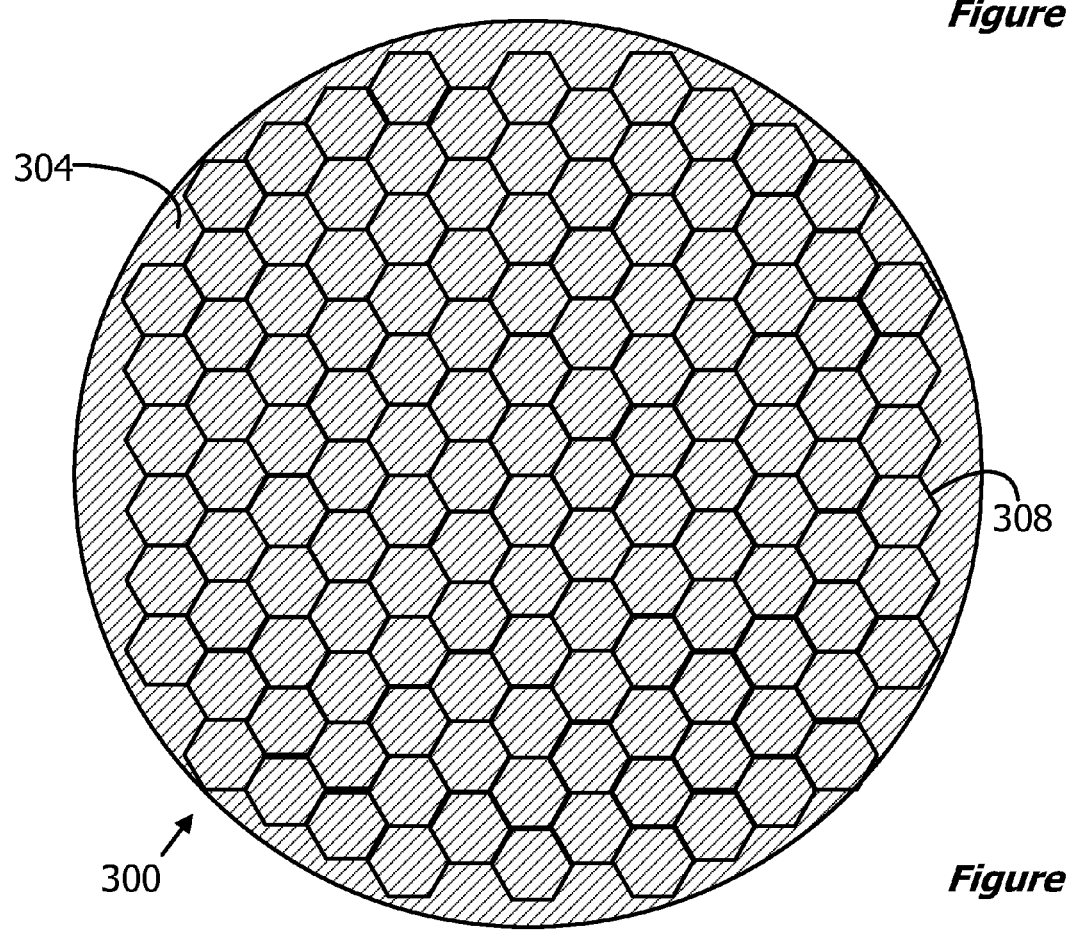
FIG. 1B is a top down view of a EUV transparent membrane and supporting mesh in accordance with various aspects of the present monolithic EUV transparent membrane and supporting mesh.

Referring to FIG. 1B, the supportive support bars 308 may advantageously be arranged to form a supportive mesh 308 on a surface of the membrane 304. The supportive mesh may advantageously be arranged in a hexagonal pattern, or any other pattern that provides the necessary structural support to the membrane 304. In addition to providing structural support to the membrane 304 and rigidity to the pellicle 300, the supportive mesh further may advantageously act to arrest cracks which may form in the membrane 304. To successfully arrest a crack, the force propagating the crack tip must be less than the tensile strength of the bars of the supportive mesh. Via Griffith's crack criterion, a bar should be sufficient to arrest propagation of a crack in the membrane if the ratio of the bar thickness to membrane thickness is at least 3:

$$\frac{t_B}{t_M} > \frac{C}{\sigma_Y \sqrt{a}}$$

Where $t_B$ is the mesh bar thickness, $t_M$ is the membrane thickness, C is the fracture toughness of the membrane, $\sigma_Y$ is the yield strength of the bar, and a is the pitch of the bar.

Figure 2A:
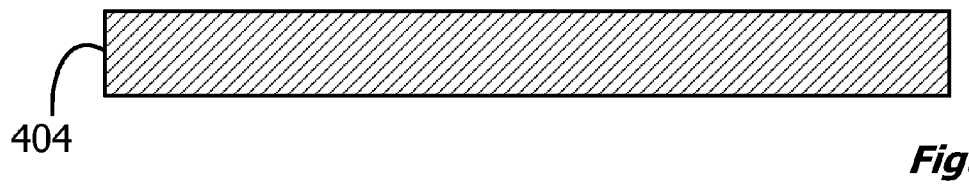
FIGS. 2A through 2I are block diagram illustrations of a partial manufacturing process flow depicting aspects of various embodiments of the present EUV pellicle manufacturing method.
Figure 2B:
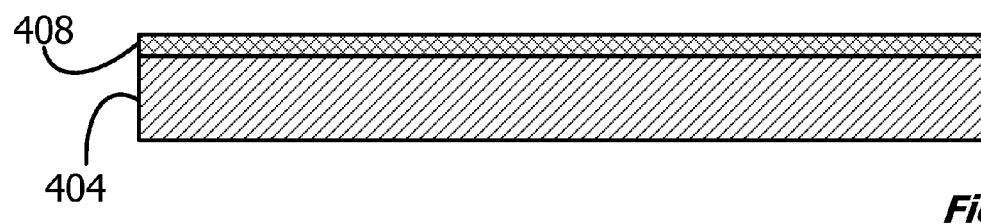
Figure 2C:
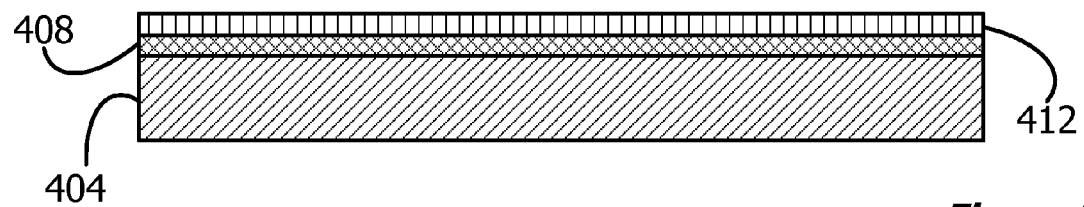

FIGS. 2A through 2I depict aspects of a method of manufacturing a monolithic, EUV transparent membrane and supporting mesh, such as, but not limited to, the pellicle embodiments described above. FIG. 2B shows a partial cross-section of a substrate 404, such as a silicon wafer, with a protection layer 408 of a release agent applied thereto. Next, as is shown in FIG. 2C, a uniform, ultrathin layer of EUV transparent membrane material 412 is deposited onto the protection layer 408. The layer of membrane material may preferably have a thickness ranging from less than one nanometer up to thirty (30) nanometers, depending on the characteristics, such as material strength and EUV transparency, of the material being used. In at least one preferred embodiment, the thickness of the membrane material is less than twenty five nanometers.

Figure 2D:
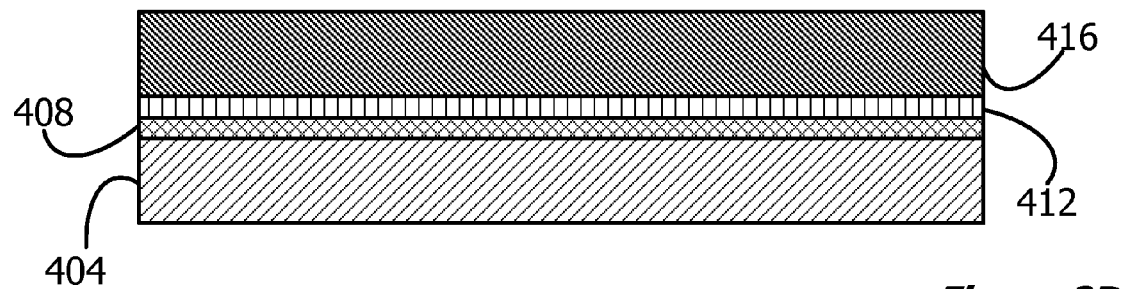
Figure 2E:
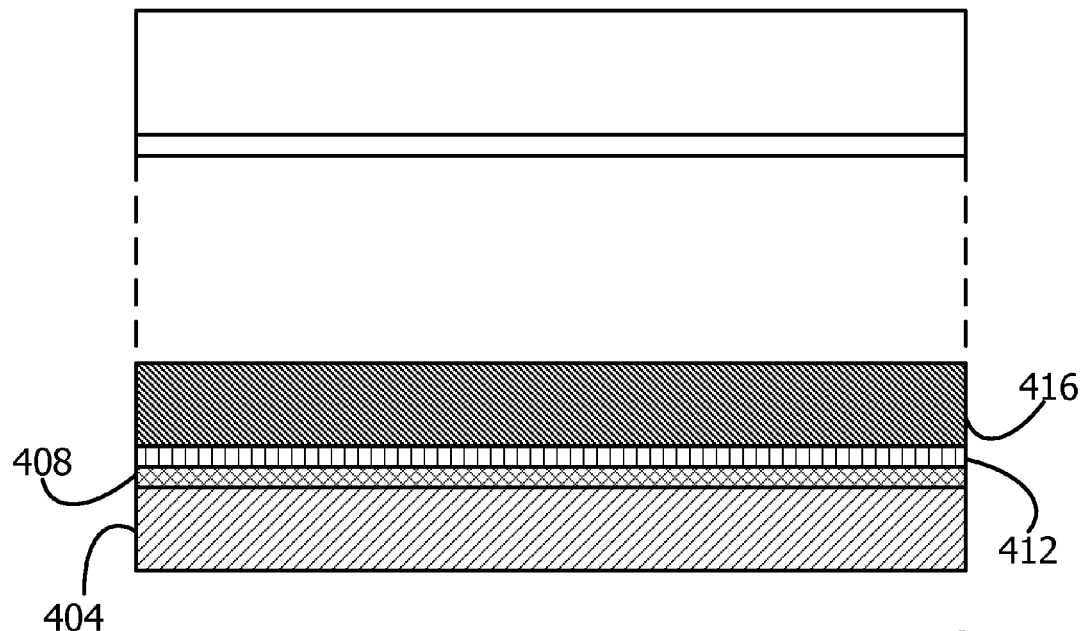
Figure 2F:
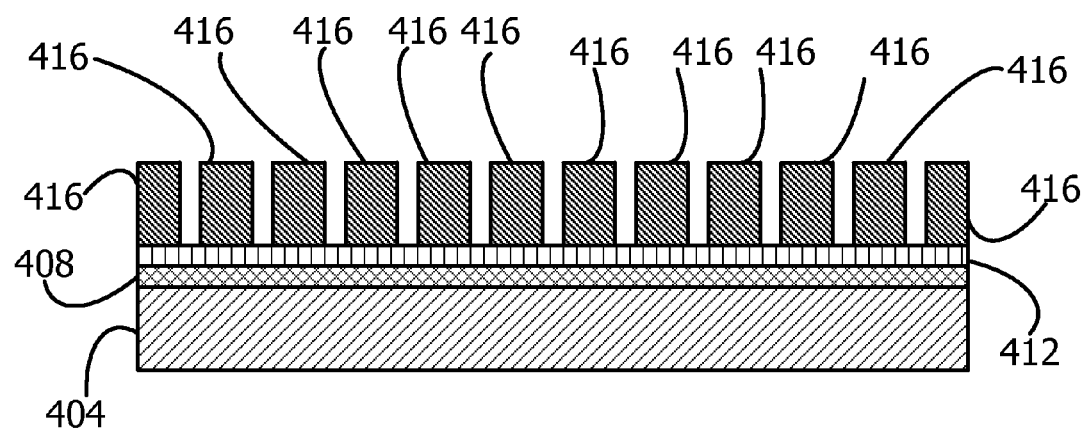

In FIG. 2D, a layer of photoresist 416 is deposited over the membrane layer 412. FIG. 2E depicts a lithographic patterning step, wherein the photoresist layer 416 is exposed to an ultraviolet light source 417. Interposed between the photoresist layer 416 and the ultraviolet light source 417 is a mask 418 having a two-dimensional pattern corresponding to the negative of the desired shape of the supporting mesh, such as the hexagonal pattern depicted in FIG. 1B. As shown in FIG. 2F, the ultraviolet light causes the areas of the photoresist layer 416 which are exposed to it to dissolve, leaving gaps 419 in the photoresist layer 416 corresponding do the desired shape of the supportive mesh.

Figure 2G:
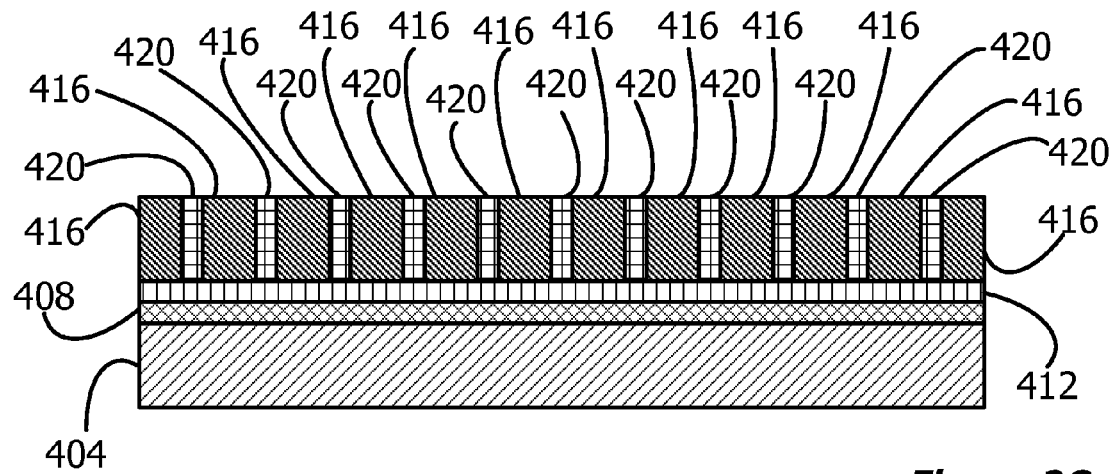
Figure 2H:
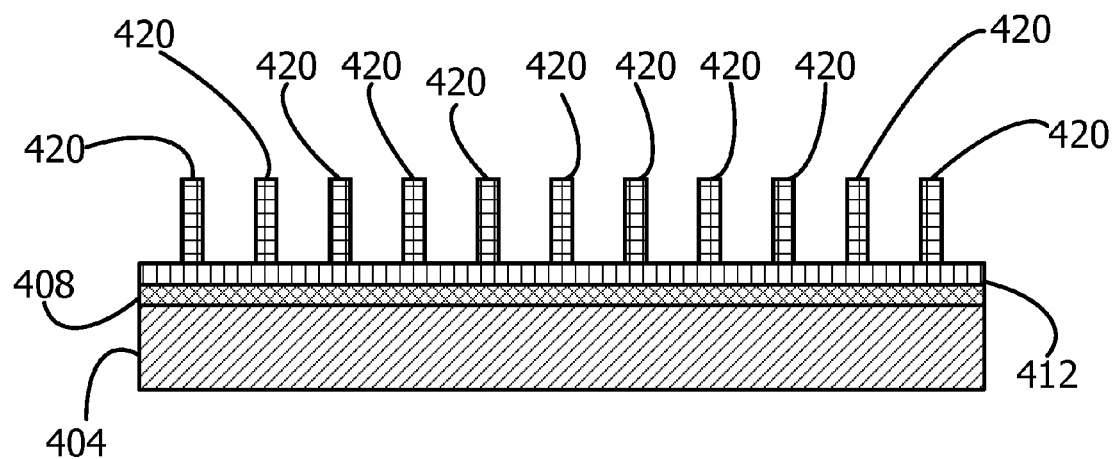
Figure 2I:
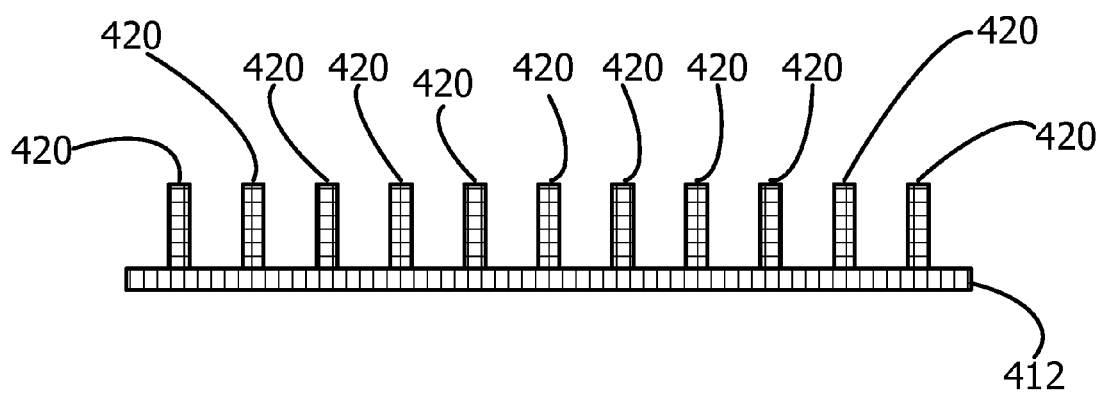

Referring to FIG. 2G, the gaps 419 in the photoresist layer 416 are then filled with a layer of material suitable for use as the supportive mesh, such as zirconium, boron, zirconium diboride ("$ZrB_2$"), carbon, silicon, niobium, and molybdenum. The layer of mesh material may preferably have a thickness ranging from less than one nanometer up to thirty (30) micrometers, depending on the characteristics, such as material strength and EUV transparency, of the material being used. In at least one preferred embodiment, the thickness of the mesh layer is between one hundred (100) and two hundred (200) nanometers. Due to the nature of the materials used and the lithographic process, the supporting mesh material bonds with the material of the membrane layer, forming a monolithic structure composed of the membrane material and the supporting mesh material.

Next, as is shown in FIG. 2G, the remaining photo resist is dissolved, leaving the monolithic combination of the supportive mesh 420 and the membrane 412. protection layer 408 are then removed allowing the monolithic structure to be removed from the substrate 404.

Exemplary embodiments of the present methods and systems have been described in detail above and in the accompanying figures for illustrative purposes. However, the scope of the present methods and systems are defined by the claims below and is not limited to the embodiments described above or depicted in the figures. Embodiments differing from those described and shown herein, but still within the scope of the defined methods and systems are envisioned by the inventors and will be apparent to persons having ordinary skill in the relevant art in view of this specification as a whole. The inventors intend for the defined methods and systems to be practiced other than as explicitly described herein. Accordingly, the defined methods and systems encompass all modifications and equivalents of the subject matter as permitted by applicable law.

That which is claimed is:

1. An apparatus, comprising:
   a membrane layer; and
   a supportive mesh;
   wherein said membrane layer and said supportive mesh form a monolithic structure that absorbs less than ten percent of EUV (Extreme Ultraviolet) light passing through it;
   wherein the membrane layer is composed of a metal-ceramic composite;
   wherein the metal-ceramic composite comprises zirconium and zirconium diboride.

2. The apparatus of claim 1, wherein the wavelength of the EUV light comprises a wavelength of 13.5 nanometers.

3. The apparatus of claim 1, wherein the thickness of the membrane layer is less than or equal to 20 to 25 nanometers.

4. The apparatus of claim 1, wherein bars of the supportive mesh have a width of 0.5 to 2 micrometers.

5. The apparatus of claim 1, wherein bars of the supportive mesh have a thickness of 50 to 200 nanometers.

6. The apparatus of claim 1, wherein bars of the supportive mesh have a pitch of 20 to 300 micrometers.

7. The apparatus of claim 1, wherein the supportive mesh absorbs an average 0.3 percent to 4 percent EUV light.

8. The apparatus of claim 1, wherein the supportive mesh is a material selected from a group consisting of zirconium, boron, zirconium diboride, carbon, silicon, niobium and molybdenum and combinations thereof.

9. The apparatus of claim 1, wherein the supportive mesh is configured to provide structural support to the membrane layer and further act to arrest cracks in said membrane layer.

10. The apparatus of claim 9, wherein the supportive mesh comprises a hexagonal structure.

11. A method of fabricating a EUV transparent membrane apparatus, comprising the steps of:
    depositing a uniform, thin membrane layer of EUV transparent material on to a substrate;
    depositing a layer of photoresist over said membrane layer;
    dissolving photoresist by means of the EUV light source in accordance with a pattern of a mask such that a desired shape of supportive mesh is obtained;
    filling mask with supportive mesh material such that said supportive mesh material bonds with the material of the membrane layer forming a monolithic structure;
    wherein said structure absorbs less than ten percent of EUV light passing through it; and
    wherein the membrane material deposited is composed of a metal-ceramic composite.

12. The method of claim 11, wherein EUV light comprises a wavelength of 13.5 nanometers.

13. The method of claim 11, wherein the thickness of the membrane layer is less than or equal to 20 to 25 nanometers.

14. The method of claim 11, wherein the desired shape is hexagonal structure.

15. The method of claim 11, wherein the supportive mesh is a materials selected from a group consisting of zirconium, boron, zirconium diboride, carbon, silicon, niobium and molybdenum and combinations thereof.

* * * * *